(12) United States Patent
Yoon et al.

(10) Patent No.: US 9,681,532 B2
(45) Date of Patent: Jun. 13, 2017

(54) LIGHT EMITTING ELEMENT MODULE

(71) Applicant: LG INNOTEK CO., LTD., Seoul (KR)

(72) Inventors: Sang In Yoon, Seoul (KR); Eun Jin Kim, Seoul (KR); Jeung Ook Park, Seoul (KR); Hyun Gu Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/901,485

(22) PCT Filed: May 8, 2014

(86) PCT No.: PCT/KR2014/004074
§ 371 (c)(1),
(2) Date: Dec. 28, 2015

(87) PCT Pub. No.: WO2014/208890
PCT Pub. Date: Dec. 31, 2014

(65) Prior Publication Data
US 2016/0381782 A1 Dec. 29, 2016

(30) Foreign Application Priority Data
Jun. 28, 2013 (KR) .................. 10-2013-0075381

(51) Int. Cl.
*H05K 1/02* (2006.01)
*H01L 33/64* (2010.01)
(Continued)

(52) U.S. Cl.
CPC ......... *H05K 1/0204* (2013.01); *H01L 33/641* (2013.01); *H01S 5/02469* (2013.01);
(Continued)

(58) Field of Classification Search
None
See application file for complete search history.

(56) References Cited

U.S. PATENT DOCUMENTS

| | | |
|---|---|---|
| 2010/0301359 A1 | 12/2010 | Liu |
| 2012/0112236 A1 | 5/2012 | Higuma et al. |
| 2014/0267979 A1* | 9/2014 | Mao .................. G02F 1/133536 349/62 |

FOREIGN PATENT DOCUMENTS

| | | |
|---|---|---|
| JP | 2009-123829 A | 6/2009 |
| KR | 10-2010-0039678 A | 6/2010 |

OTHER PUBLICATIONS

Noh, Bo-In, et al.; "Effect of Ni—Cr Seed Layer Thickness on the Adhesion Characteristics of Flexible Copper Clad Laminates Fabricated using a Roll-to-Roll Process"; Metals and Materials International, Oct. 26, 2010, vol. 16, No. 5, pp. 779-784 (http://link.springer.com/article/10.1007/s12540-010-1013-8).

(Continued)

*Primary Examiner* — Matthew Reames
*Assistant Examiner* — Steven B Gauthier
(74) *Attorney, Agent, or Firm* — KED & Associates, LLP

(57) ABSTRACT

A light emitting element module according to an embodiment of the present invention includes a first metal substrate; a second metal substrate on the first metal substrate; an insulation layer on the second metal substrate and including at least one of a carbide-based insulation material and a nitride-based insulation material; a circuit pattern on the insulation layer; and a light emitting element on the insulation layer.

20 Claims, 3 Drawing Sheets

(51) Int. Cl.
    *H05K 1/05*     (2006.01)
    *H05K 3/38*     (2006.01)
    *H01S 5/024*     (2006.01)
    *H05K 3/32*     (2006.01)
    *H01L 33/62*     (2010.01)

(52) U.S. Cl.
    CPC .............. *H05K 1/053* (2013.01); *H05K 3/321* (2013.01); *H05K 3/388* (2013.01); *H01L 33/62* (2013.01); *H05K 2201/0323* (2013.01); *H05K 2201/10106* (2013.01)

(56) References Cited

OTHER PUBLICATIONS

International Search Report dated Aug. 14, 2014 issued in Application No. PCT/KR2014/004074 (English text).

\* cited by examiner

[Figure 1]
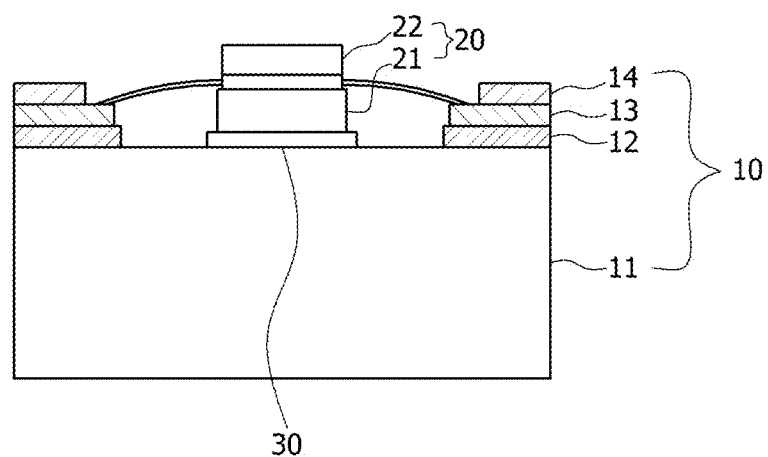
[Figure 2]
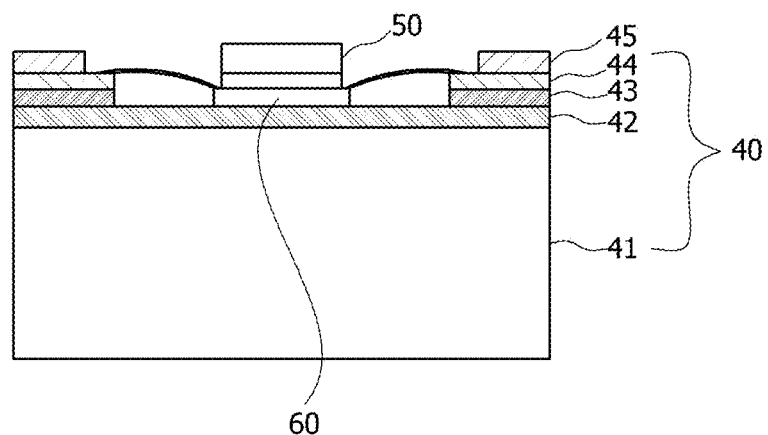

[Figure 3]
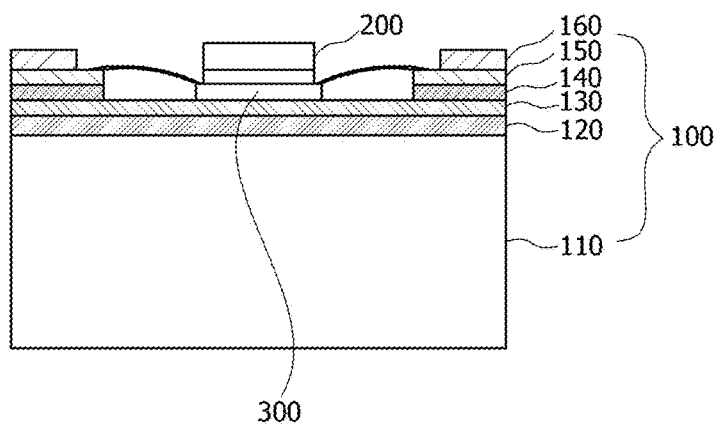
[Figure 4]
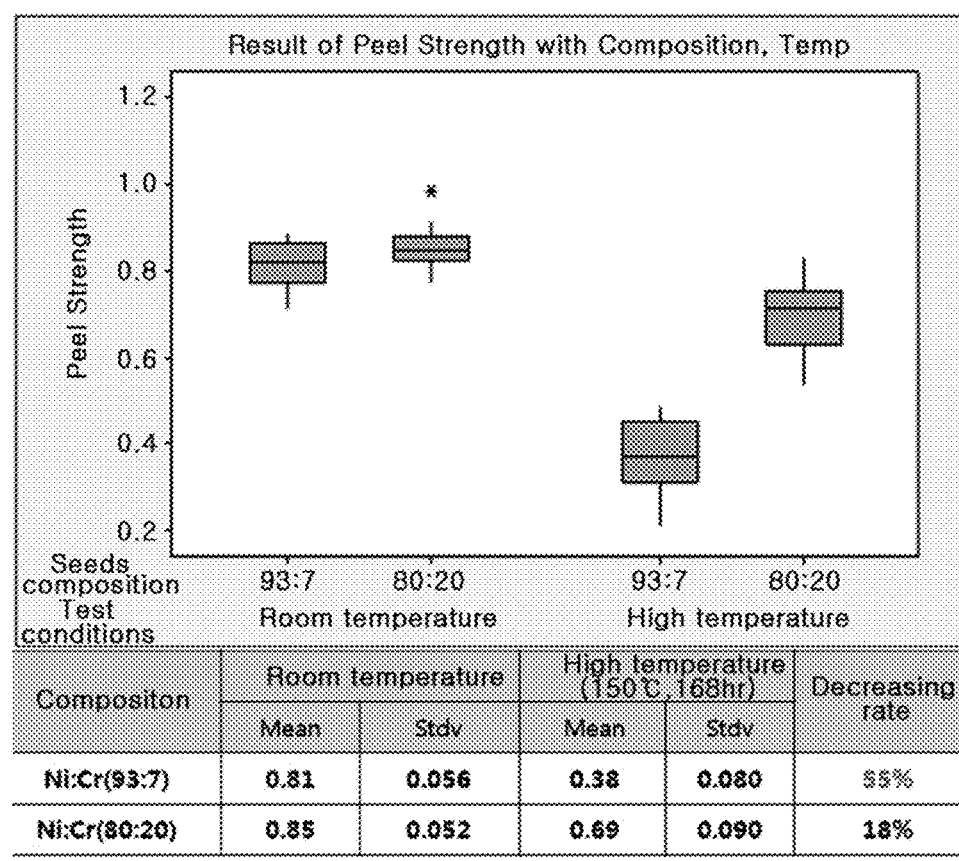

[Figure 5]
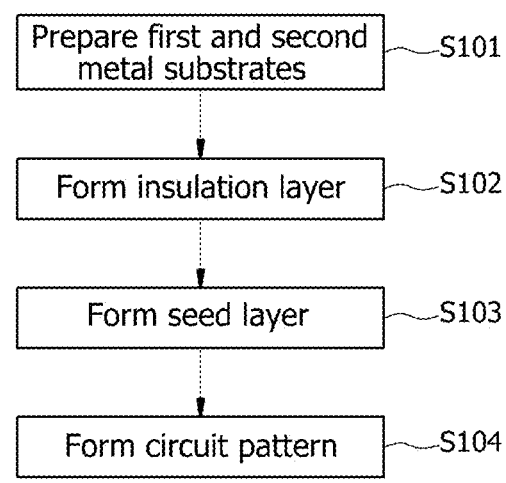

LIGHT EMITTING ELEMENT MODULE

CROSS-REFERENCE TO RELATED PATENT APPLICATIONS

This application is a U.S. National Stage Application under 35 U.S.C. §371 of PCT Application No. PCT/KR2014/004074, filed May 8, 2014, which claims priority to Korean Patent Application No. 10-2013-0075381, filed Jun. 28, 2013, whose entire disclosures are hereby incorporated by reference.

TECHNICAL FIELD

A light emitting element is a device which converts electricity into light. A light emitting diode (LED), a laser diode (LD) and the like are typical light emitting elements.

BACKGROUND ART

The light emitting diode is a device which emits light when current is applied and electrons and holes meet at the P-N semiconductor junction (P-N junction), and it is generally manufactured in a structure of a module on which the light emitting diode is mounted. A light emitting diode module is configured to be mounted on a printed circuit board (PCB) and operate to emit light when it receives current from an electrode formed on the printed circuit board.

In such a light emitting diode module, heat generated by the light emitting diode directly affects light emitting performance and lifespan of the light emitting diode module. If the heat generated by the light emitting diode stays in the light emitting diode for a long time, dislocation and mismatch occur in the crystal structure configuring the light emitting diode, and this will act as a cause for reducing the lifespan of the light emitting diode module.

Accordingly, techniques for accelerating dissipation of heat generated by a light emitting diode are proposed. For example, a light emitting diode package having a ceramic substrate combined with a light emitting diode chip can be mounted on a circuit substrate, or a light emitting diode chip can be mounted in a Chip On Board (COB) method after an aluminum oxide ($Al_2O_3$) insulation layer is formed by performing anodization on an aluminum substrate.

Expensive Nitride-based aluminum nitride (AlN) may be used for the ceramic substrate applied to the light emitting diode package. In addition, thickness of the ceramic substrate should be 400 μm or more to secure durability. Accordingly, the unit price is increased if the ceramic substrate is applied to the light emitting diode package, and there is a limit in lowering thermal resistance of the vertical direction.

In the case of the COB method using an aluminum oxide insulation layer, the unit price can be lowered since the expensive ceramic substrate is omitted. However, it is difficult to implement high heat dissipation performance since characteristics of high thermal resistance and low withstand voltage are shown compared with a case of applying a ceramic substrate, and it is difficult to apply the light emitting diode module to a high power product such as a head lamp.

DISCLOSURE

Technical Problem

The present invention has been made in view of the above problems, and it is an object of the present invention to provide a light emitting element module which can reduce manufacturing cost while enhancing heat dissipation performance.

Technical Solution

To accomplish the above object, according to one aspect of the present invention, there is provided a light emitting element module including: a first metal substrate; a second metal substrate on the first metal substrate; an insulation layer on the second metal substrate and comprising at least one of a carbide-based insulation material and a nitride-based insulation material; a circuit pattern on the insulation layer; and a light emitting element on the insulation layer.

The first metal substrate may contain a metal having a thermal resistance lower than that of the second metal substrate.

The first metal substrate may contain copper, and the second metal substrate may contain aluminum.

The first metal substrate and the second metal substrate may be clad substrates.

The carbide-based insulation material may contain aluminum silicon carbide (AlSiC), and the nitride-based insulation material may contain at least one of aluminum nitride (AlN) and aluminum silicon nitride (AlSiN).

The light emitting element module may further include a seed layer formed between the insulation layer and the circuit pattern.

The seed layer may contain at least one of nickel and chrome.

A composition ratio between the nickel and the chrome of the seed layer may be between 70:30 and 97:3.

The composition ratio between the nickel and the chrome of the seed layer may be between 80:20 and 97:3.

At least one of the insulation layer and the seed layer may be formed in a vacuum deposition (sputtering) method.

Advantageous Effects

According to an embodiment of the present invention, if a circuit substrate is configured using a carbide-based or nitride-based insulation layer, it is effective in that manufacturing cost can be lowered since an insulation layer may substitute for a ceramic substrate of a light emitting element package.

Furthermore, since the heat dissipation function of a light emitting element is improved without using a ceramic substrate by using a carbide-based or nitride-based insulation layer of low thermal resistance, a light emitting element module can be applied to a high power product.

DESCRIPTION OF DRAWINGS

FIG. 1 is a cross-sectional view showing a light emitting element module to which a ceramic substrate is applied.

FIG. 2 is a cross-sectional view showing a light emitting element module installed in a COB method.

FIG. 3 is a cross-sectional view showing a light emitting element module according to an embodiment of the present invention.

FIG. 4 is a graph showing changes of adhesion according to a Ni—Cr composition ratio of a seed layer according to an embodiment of the present invention.

FIG. 5 is a flowchart illustrating a method of manufacturing a circuit substrate for a light emitting element according to an embodiment of the present invention.

BEST MODE

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

It will be understood that, although the terms including ordinal numbers such as first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terms used herein is for the purpose of describing particular embodiments only and is not intended to be limiting of example embodiments. As used herein, the singular forms are intended to include the plural forms as well, unless the context clearly indicates otherwise.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted to have the meanings equal to the contextual meanings in the relevant field of art, and are not to be interpreted to have ideal or excessively formal meanings unless clearly defined in the present application.

In the description of the embodiments, if each layer (film), region, pattern or structure is formed "above/on" or "below/under" a substrate, a layer (film), a region, a pad or a pattern, the "above/on" and "below/under" include forming the layer (film), region, pattern or structure "directly" or "indirectly with intervention of another layer". In addition, the reference point of the "above/on" and "below/under" of each layer will be described with reference to the drawings.

The thickness and size of each layer shown in the drawings may be exaggerated, omitted or schematically illustrated for sake of convenience and clarity of description. In addition, the size of each constitutional component does not fully reflect an actual size.

FIG. 1 is a view showing an example of a light emitting element module, in which a case of using a light emitting element package applying a ceramic substrate is shown as an example.

Referring to FIG. 1, a circuit substrate 10 includes a metal substrate 11, an insulation layer 12, a circuit pattern 13 and a protection layer 14.

A light emitting element package 20 combined with a ceramic substrate 21 is installed on one side of the circuit substrate 10. The light emitting element package 20 is bonded on the circuit substrate 10 using a conductive adhesive 30 as a medium.

Meanwhile, as shown in FIG. 1, when a light emitting element 22 of a chip shape and the ceramic substrate 21 are packaged and installed on the circuit substrate 10, the unit price is increased since the ceramic substrate 21 is used. In addition, since thermal resistance of the vertical direction is increased due to the ceramic substrate 21, heat dissipation performance of the light emitting element 22 may be lowered.

FIG. 2 is a view showing another example of a light emitting element module, in which a case of installing a light emitting element in a COB method applying an aluminum oxide insulation layer is shown as an example.

Referring to FIG. 2, a circuit substrate 40 includes a metal substrate 41, an aluminum oxide ($Al_2O_3$) insulation layer 42, a seed layer 43, a circuit pattern 44 and a protection layer 45.

The metal substrate 41 may be made of an aluminum (AL) material to form the aluminum oxide insulation layer 42.

The aluminum oxide insulation layer 42 may be formed by anodizing the surface of the aluminum metal substrate 41. The seed layer 43 for improving adhesion between the aluminum oxide insulation layer 42 and the circuit pattern 44 is formed on one side of the aluminum oxide insulation layer 42, and the circuit pattern 44 is formed on one side of the seed layer 43.

A light emitting element 50 is installed on the aluminum oxide insulation layer 42 of the circuit substrate 40 in a COB method by a conductive adhesive 60 without a ceramic substrate.

Meanwhile, as shown in FIG. 2, when the aluminum oxide insulation layer 42 is applied, the unit price can be lowered since the aluminum oxide insulation layer 42 may substitute for a ceramic substrate. However, it is difficult to implement high heat dissipation performance due to high thermal resistance and low withstand voltage of the aluminum oxide insulation layer 42, and thus it is difficult to apply the light emitting element module to a high power product.

Accordingly, in the embodiment of the present invention, it is possible to substitute the ceramic substrate applied to a light emitting element package, and a carbide-based or nitride-based insulation layer having relatively low thermal resistance and high withstand voltage compared with the aluminum oxide insulation layer is applied.

Hereinafter, a method of manufacturing a light emitting element module and a circuit substrate configuring the light emitting element module according to an embodiment of the present invention will be described in detail with reference to needed drawings.

FIG. 3 is a cross-sectional view showing a light emitting element module according to an embodiment of the present invention.

Referring to FIG. 3, a circuit substrate 100 includes a first metal substrate 110, a second metal substrate 120, an insulation layer 130, a seed layer 140, a circuit pattern 150 and a protection layer 160.

The first metal substrate 110 is configured of a copper (Cu) substrate of low thermal resistance and performs a heat dissipation function for radiating the heat generated by the light emitting element 200 to outside.

The second metal substrate 120 is stacked on one side of the first metal substrate 110. The second metal substrate 120 is configured of an aluminum substrate and performs a function of improving adhesion between the first metal substrate 110 of a copper material and the insulation layer 130.

The first metal substrate 110 and the second metal substrate 120 may be provided as a clad substrate in order to improve durability of the circuit substrate 100. The clad substrate is formed by combining the first metal substrate 110 and the second metal substrate 120 in a hot or cold rolling method.

The second metal substrate 120 of an aluminum material is relatively light-weighted and has high thermal resistance compared with the first metal substrate 110 of a copper material. Accordingly, thickness of the second metal substrate 120 configuring the clad substrate may be designed differently according to the characteristics of a product to which the light emitting element module is applied.

For example, since heat dissipation performance is important when the light emitting element module is applied to a high power product, thickness of the second metal substrate 120 of relatively high thermal resistance may be designed to be less than 200 m. Contrarily, when the light emitting element module is applied to a product aiming at light-weightiness, thickness of the second metal substrate 120 may be designed to be 200 m or more.

The insulation layer 130 is formed on one side of the second metal substrate 120.

The insulation layer 130 contains a carbide-based insulation material such as aluminum silicon carbide (AlSiC) or the like or a nitride-based insulation material such as aluminum nitride (AlN), aluminum silicon nitride (AlSiN) or the like.

The insulation layer 130 is formed on the second metal substrate 120 in a vacuum deposition (sputtering) method. The insulation layer 130 is formed to have a thickness larger than 50 μm to increase withstand voltage reliability of the circuit substrate 100.

The seed layer 140 is formed on one side of the insulation layer 130 in a vacuum deposition method.

The seed layer 140 is for improving high temperature adhesion between the insulation layer 130 and the circuit pattern 150 and is made of nickel and chrome. Adhesion of the seed layer 140 varies according to the thickness of the seed layer 140 and the composition ratio between the nickel and the chrome.

FIG. 4 is a graph showing changes of adhesion according to a Ni—Cr composition ratio of a seed layer according to an embodiment of the present invention. Adhesion of a Ni—Cr seed layer is measured at ⅓ oz of Cu.

Referring to FIG. 4, a Ni—Cr seed layer having a Ni—Cr weight composition ratio of 93:7 at a room temperature shows adhesion of an average of 0.81 kgf/cm$^2$ and a standard deviation of 0.056 kgf/cm$^2$. In addition, a Ni—Cr seed layer having a Ni—Cr weight composition ratio of 80:20 at a room temperature shows adhesion of an average of 0.85 kgf/cm$^2$ and a standard deviation of 0.052 kgf/cm$^2$.

On the other hand, in a high temperature environment exposing the light emitting element module at a high temperature of 150° C. or higher, a Ni—Cr seed layer having a Ni—Cr composition ratio of 93:7 shows adhesion of an average of 0.38 kgf/cm$^2$ and a standard deviation of 0.080 kgf/cm$^2$. In the case of a Ni—Cr seed layer having a Ni—Cr composition ratio of 93:7, it is understood that the adhesion in the high temperature environment is lowered by 55% compared with a room temperature environment.

In addition, in a high temperature environment, a Ni—Cr seed layer having a Ni—Cr composition ratio of 80:20 shows adhesion of an average of 0.69 kgf/cm$^2$ and a standard deviation of 0.090 kgf/cm$^2$. In the case of a Ni—Cr seed layer having a Ni—Cr composition ratio of 80:20, it is understood that the adhesion in the high temperature environment is lowered by 18% compared with a room temperature environment.

As shown in FIG. 4, it is understood that as the composition ratio of chrome is increased in the Ni—Cr seed layer, reduction of adhesion in the high temperature environment is lowered. However, if the composition ratio of the chrome is higher than a predetermined ratio, for example, more than 30%, it can be a cause of short-circuit of a pattern since the chrome remains on the surface of the insulation layer 130 when the circuit pattern 150 is etched.

Accordingly, the composition ratio of nickel and chrome of the seed layer 140 according to an embodiment of the present invention is determined between 80:20 and 97:3.

Returning to FIG. 3, the circuit pattern 150 is formed on one side of the seed layer 130. The circuit pattern 150 is formed using copper or a metal layer containing copper as a main component.

The protection layer 160 is formed on one side of the circuit pattern 150. The protection layer 160 performs a function of electrical insulation and mitigates electrical or physical shock for the circuit substrate 100.

The protection layer 160 is formed using a solder resist, a coverlay and the like.

The light emitting element 200 is mounted on the circuit substrate 100 in a COB method without using a ceramic substrate. That is, the light emitting element 200 is directly installed on the insulation layer 120 of the circuit substrate 100 using the conductive adhesive 300 as a medium. In addition, each of wires connected to the anode and cathode terminals of the light emitting element 200 is electrically connected to the circuit pattern 150.

The conductive adhesive 300 is an adhesive having electrical conductivity, and a metal paste or the like is used as the adhesive.

FIG. 5 is a flowchart illustrating a method of manufacturing a circuit substrate configuring a light emitting element according to an embodiment of the present invention.

Referring to FIG. 5, a second metal substrate 120 of an aluminum material is stacked on a first metal substrate 110 of a copper material, and a clad substrate is prepared through hot or cold rolling S101.

Next, a carbide-based or nitride-based insulation layer 130 is formed on one side of the second metal substrate 120 through a vacuum deposition process S102.

Next, a seed layer 140 for improving adhesion of a circuit pattern 150 is formed on one side of the insulation layer 130 S103. The seed layer 140 is formed through a vacuum deposition process.

Next, the circuit pattern 150 is formed on one side of the seed layer 140 through an etching process or the like S104.

As described above, if a circuit substrate is configured using a carbide-based or nitride-based insulation layer, it is effective in that manufacturing cost can be lowered since an insulation layer may substitute for a ceramic substrate of a luminous element package.

Furthermore, since the heat dissipation function of a light emitting element is improved without using a ceramic substrate by using a carbide-based or nitride-based insulation layer of low thermal resistance, a light emitting element module can be applied to a high power product.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

| | |
|---|---|
| 100: | Circuit substrate |
| 110: | Copper substrate |
| 120: | Aluminum substrate |
| 130: | Insulation layer |
| 140: | Seed layer |
| 150: | Circuit pattern |
| 160: | Protection layer |
| 200: | light emitting element |
| 300: | Conductive adhesive |

The invention claimed is:

1. A light emitting element module comprising:
a first metal substrate;
a second metal substrate on the first metal substrate;
an insulation layer on the second metal substrate and comprising at least one of a carbide-based insulation material and a nitride-based insulation material;
a circuit pattern on the insulation layer; and
a light emitting element on the insulation layer.

2. The module according to claim 1, wherein the first metal substrate contains a metal having a thermal resistance lower than that of the second metal substrate.

3. The module according to claim 1, wherein the first metal substrate contains copper, and the second metal substrate contains aluminum.

4. The module according to claim 1, wherein the first metal substrate and the second metal substrate are clad substrates.

5. The module according to claim 1, wherein the carbide-based insulation material contains aluminum silicon carbide (AlSiC), and the nitride-based insulation material contains at least one of aluminum nitride (AlN) and aluminum silicon nitride (AlSiN).

6. The module according to claim 1, further comprising a seed layer formed between the insulation layer and the circuit pattern.

7. The module according to claim 6, wherein the seed layer contains at least one of nickel and chrome.

8. The module according to claim 7, wherein a composition ratio between the nickel and the chrome of the seed layer is between 70:30 and 97:3.

9. The module according to claim 8, wherein the composition ratio between the nickel and the chrome of the seed layer is between 80:20 and 97:3.

10. The module according to claim 1, wherein at least one of the insulation layer and the seed layer is formed in a vacuum deposition (sputtering) method.

11. The module according to claim 1, further comprising a protection layer formed on the circuit pattern.

12. The module according to claim 1, wherein the light emitting element is directly installed on the insulation layer in a Chip On Board (COB) method.

13. The module according to claim 12, wherein the light emitting is installed on the insulation layer using a conductive adhesive.

14. The module according to claim 13, wherein the conductive adhesive comprises metal paste.

15. A circuit board comprising:
a first metal substrate;
a second metal substrate on the first metal substrate;
an insulation layer on the second metal substrate and comprising at least one of a carbide-based insulation material and a nitride-based insulation material; and
a circuit pattern on the insulation layer.

16. The circuit board according to claim 15, wherein the first metal substrate contains copper, and the second metal substrate contains aluminum.

17. The circuit board according to claim 16, wherein the carbide-based insulation material contains aluminum silicon carbide (AlSiC), and the nitride-based insulation material contains at least one of aluminum nitride (AlN) and aluminum silicon nitride (AlSiN).

18. The circuit board according to claim 15, further comprising a seed layer formed between the insulation layer and the circuit pattern.

19. The circuit board according to claim 18, wherein the seed layer contains at least one of nickel and chrome.

20. The circuit board according to claim 15, further comprising a protection layer formed on the circuit pattern.

* * * * *